United States Patent
Park et al.

(10) Patent No.: US 10,013,308 B2
(45) Date of Patent: Jul. 3, 2018

(54) SEMICONDUCTOR DEVICE AND DRIVING METHOD THEREOF

(71) Applicant: SK hynix Inc., Icheon-si, Gyeonggi-do (KR)

(72) Inventors: Min Su Park, Seoul (KR); Jin Hee Cho, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 12 days.

(21) Appl. No.: 15/062,548

(22) Filed: Mar. 7, 2016

(65) Prior Publication Data

US 2017/0123904 A1 May 4, 2017

(30) Foreign Application Priority Data

Nov. 2, 2015 (KR) .......................... 10-2015-0153361

(51) Int. Cl.
| | |
|---|---|
| *G06F 11/10* | (2006.01) |
| *G11C 29/52* | (2006.01) |
| *G11C 7/14* | (2006.01) |
| *G11C 11/56* | (2006.01) |
| *G11C 29/04* | (2006.01) |

(52) U.S. Cl.
CPC ...... *G06F 11/1068* (2013.01); *G06F 11/1048* (2013.01); *G11C 29/52* (2013.01); *G11C 7/14* (2013.01); *G11C 11/5642* (2013.01); *G11C 2029/0411* (2013.01)

(58) Field of Classification Search
CPC .................................................... G06F 11/1076
USPC .......................... 714/764, 754, 718, 746, 801
See application file for complete search history.

(56) References Cited

U.S. PATENT DOCUMENTS

| | | | |
|---|---|---|---|
| 4,727,516 A | 2/1988 | Yoshida et al. | |
| 6,532,181 B2 | 3/2003 | Saito et al. | |
| 6,657,907 B2 | 12/2003 | Lee | |
| 7,219,272 B2 * | 5/2007 | Osada | G11C 29/848 365/201 |
| 7,313,036 B2 | 12/2007 | Kim | |
| 8,102,689 B2 | 1/2012 | Hong et al. | |
| 8,683,299 B2 | 3/2014 | Gunnam et al. | |

(Continued)

FOREIGN PATENT DOCUMENTS

| | | |
|---|---|---|
| KR | 100876807 B1 | 1/2009 |
| KR | 1020090099757 A | 9/2009 |

(Continued)

*Primary Examiner* — Fritz Alphonse
(74) *Attorney, Agent, or Firm* — William Park & Associates Ltd.

(57) ABSTRACT

Provided are a semiconductor device including an error correction code circuit and a driving method thereof. The semiconductor device includes a plurality of normal mats including a plurality of memory cells and connected to data lines, a plurality of dummy mats arranged in specific areas of the plurality of normal mats and inputting/outputting parity bits through parity lines of a specific circuit, a plurality of free ECC (Error Correction Code) calculation circuits that perform ECC calculation corresponding to data applied through the data lines and the parity lines, and a main ECC calculation circuit that combines data applied from the plurality of free ECC calculation circuits with one another and performs ECC calculation.

20 Claims, 7 Drawing Sheets

(56) References Cited

U.S. PATENT DOCUMENTS

| | | | |
|---|---|---|---|
| 2006/0034142 A1* | 2/2006 | Ooishi | G11C 8/10 |
| | | | 365/230.06 |
| 2007/0242535 A1* | 10/2007 | Kajigaya | G11C 5/025 |
| | | | 365/189.09 |
| 2009/0241008 A1 | 9/2009 | Kim et al. | |
| 2010/0188891 A1* | 7/2010 | Taniguchi | G11C 14/0081 |
| | | | 365/158 |
| 2014/0157065 A1 | 6/2014 | Ong | |
| 2015/0113342 A1 | 4/2015 | Jung et al. | |

FOREIGN PATENT DOCUMENTS

| KR | 1020100053203 A | 5/2010 |
|---|---|---|
| KR | 1020140001483 A | 1/2014 |

\* cited by examiner

SEMICONDUCTOR DEVICE AND DRIVING METHOD THEREOF

CROSS-REFERENCES TO RELATED APPLICATION

The present application claims priority under 35 U.S.C. § 119(a) to Korean application number 10-2015-0153361, filed on Nov. 2, 2015, in the Korean Intellectual Property Office, which is incorporated herein by reference in its entirety.

BACKGROUND

1. Technical Field

Various embodiments generally relate to a semiconductor device and a driving method thereof, and more particularly, to a semiconductor device including an error correction code circuit.

2. Related Art

A typical semiconductor device includes a plurality of memory cell arrays having a plurality of unit cells for storing and outputting data according to addresses, and a plurality of sense amplifier arrays for amplifying and outputting data signals outputted from the cell arrays.

Recently, as relates to a semiconductor memory device, there have been increasing efforts to develop a technology for increasing net dies in order to improve manufacturing costs. Among the efforts, there has been proposed a way of converting a cell array structure of 8F2 into a cell array structure of 6F2 or 4F2. The cell array structure of 6F2 has recently and continuously been spotlighted because integration of many more cells per unit area is possible as compared with the cell array structure of 8F2.

In general, the 8F2 employs a folded bit line structure and the 6F2 employs an open bit line structure. In the folded bit line structure, a bit line BL and a bit bar line BLB are formed on one side of a sense amplifier, and in the open bit line structure, the bit line BL and the bit bar line BLB are formed at both sides of the sense amplifier.

The open bit line structure will be described in detail below. A semiconductor device having the open bit line structure includes a plurality of memory cell mats, a plurality of sense amplifier arrays S/A arrays, and a dummy mat.

In each of the plurality of memory cell mats, memory cells for storing data may be formed. The memory cells are arranged in crossing areas of bit lines and word lines and crossing areas of bit bar lines BLB and sub-word lines SWL. The memory cell includes an NMOS transistor which is a cell transistor and a cell capacitor.

The dummy mat is a mat arranged at the uppermost end and the lowermost end of the memory cell mat, that is, at the outer peripheral portion of a memory cell block. Further, the dummy mat is arranged at a lower end of a target cell mat to provide the target cell mat with a level of a bit bar line to be compared with. With such a dummy mat, a plurality of bit lines and a plurality of dummy word lines which are arranged to cross each other may be formed in a manner similar to each memory cell array block.

However, in the dummy mat, since only a bit bar line (or a bit line), which is compared with the target cell mat and is connected to a sense amplifier, actually operates, a bit line (or a bit bar line) in the dummy mat does not operate and unnecessarily occupies an area. Therefore, net dies may be reduced.

Furthermore, as a voltage that is applied to a memory cell is lowered and a cell size is reduced, deterioration of a soft error tolerance has been problematic. In a semiconductor integrated device using an ECC (Error Correction code) circuit for correcting data errors, a circuit technology for adding a parity bit to typical data and correcting a failed bit has been proposed.

SUMMARY

Various embodiments are directed to utilize a dummy mat of a semiconductor device as an error correction code circuit.

In an embodiment, a semiconductor device includes: a plurality of normal mats including a plurality of memory cells and connected to data lines; a plurality of dummy mats arranged in specific areas of the plurality of normal mats and inputting/outputting parity bits through parity lines of a specific circuit; a plurality of free ECC (Error Correction Code) calculation circuits that perform ECC calculations corresponding to data applied through the data lines and the parity lines; and a main ECC calculation circuit that combines data applied from the plurality of free ECC calculation circuits with one another and performs an ECC calculation.

In an embodiment, a semiconductor device includes: a plurality of normal mats including a plurality of memory cells and connected to data lines; a plurality of dummy mats arranged in specific areas of the plurality of normal mats, inputting/outputting parity bits through parity lines of a specific unit, and inputting/outputting flag bits through flag lines of a specific unit; a plurality of selection units that selectively control output of the parity bits of the parity lines in correspondence to selection signals; a plurality of free ECC (Error Correction Code) calculation units that perform ECC calculation in correspondence to data applied through the data lines and the parity lines; and a main ECC calculation unit that combines data applied from the plurality of free ECC calculation units with one another and performs ECC calculation.

In an embodiment, a driving method of a semiconductor device includes the steps of: reading data of normal mats and data stored in dummy mats in a refresh operation; receiving data of flag lines connected to the dummy mats and determining whether a flag bit is at a first logic level; calculating parity bits and writing a flag bit having a second logic level in the dummy mats when the flag bit is at the first logic level, and reading the data of the normal mats and parity data of the dummy mats, calculating a plurality of ECC parities, and correcting an error when the flag bit is not at the first logic level; and performing a precharge operation with respect to banks including the normal mats and the dummy mats.

According to the present disclosure, a dummy mat of a semiconductor device is utilized as an error correction code circuit, resulting in an effect that net dies of a chip increase and data reliability can be improved.

DETAILED DESCRIPTION

Hereinafter, a semiconductor device and a driving method thereof will be described below with reference to the accompanying drawings through various examples of embodiments.

Figure 1:
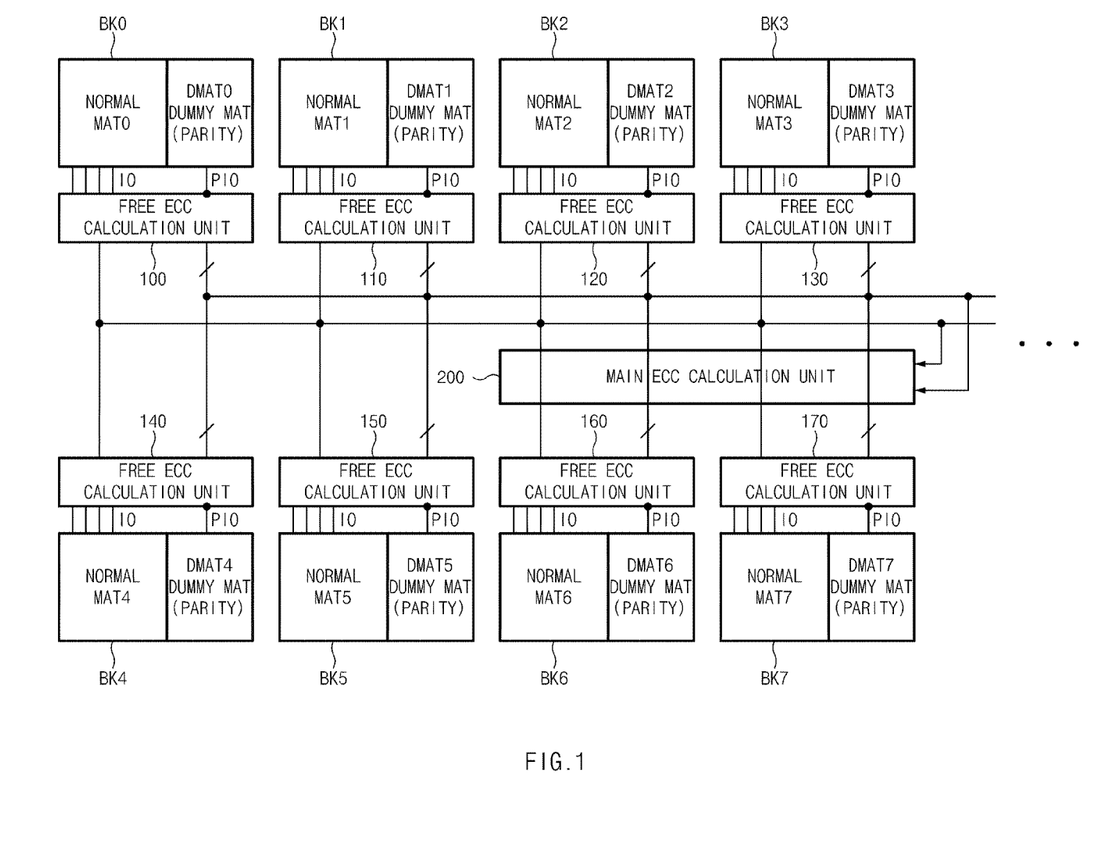
FIG. 1 is a configuration diagram of a semiconductor device according to an embodiment of the present disclosure.

FIG. 1 is a configuration diagram of a semiconductor device according to an embodiment of the present disclosure.

The embodiment of the present disclosure includes a plurality of banks BK0 to BK7, a plurality of free error correction code (hereinafter, referred to as ECC) calculation units 100, 110, 120, 130, 140, 150, 160, and 170, and a main ECC calculation unit 200. As used herein, a calculation unit or any other type of unit may also be referred to as a circuit. Thus, the calculation units 100, 110, 120, 130, 140, 150, 160, and 170 may be referred to as a calculation circuit. Further, the main ECC calculation unit 200 may be referred to as the main ECC calculation circuit 200. This applies to all other components referred to herein as units.

The semiconductor device is divided into the plurality of banks BK0 to BK7 and that are driven. The plurality of banks BK0 to BK7 include a plurality of normal mats MAT0 to MAT7 each having a plurality of memory cells, and a plurality of dummy mats DMAT0 to DMAT7, respectively.

That is, a memory cell array is divided into sets of the normal mats MAT0 to MAT7 including a plurality of unit memory cells. A plurality of these normal mats MAT0 to MAT7 are arranged in a row direction and a column direction to form a plurality of mat rows and a plurality of mat columns.

Mats that are arranged in specific areas of the plurality of normal mats MAT0 to MAT7, such as an outermost peripheral portion of the plurality of normal mats MAT0 to MAT7, may be used as dummy mats DMAT0 to DMAT7. Such dummy mats DMAT0 to DMAT7 may be assigned as areas for storing parity bits.

Furthermore, the plurality of free ECC calculation units 100, 110, 120, 130, 140, 150, 160, and 170 are connected to the plurality of banks BK0 to BK7 through data lines I0 and parity lines PI0. The plurality of free ECC calculation units 100, 110, 120, 130, 140, 150, 160, and 170 perform an ECC operation in units of one bank BK, respectively, on the data lines I0 and the parity lines PI0.

The plurality of normal mats MAT0 to MAT7 input/output data of a specific unit through the data lines I0. Furthermore, the plurality of dummy mats DMAT0 to DMAT7 input/output parity bits of a specific unit through the parity lines PI0.

As described above, in the embodiment of the present disclosure, the data lines I0 for inputting/outputting normal data and the parity lines PI0 for inputting/outputting parity bits are separated from each other. In such a case, in a write or read operation, data may be inputted/outputted through the data lines I0 separately from the parity lines PI0.

The free ECC calculation units 100, 110, 120, 130, 140, 150, 160, and 170 perform an ECC operation corresponding to a read or write command in a normal active mode.

That is, in a read operation of the banks BK0 to BK7, the free ECC calculation units 100, 110, 120, 130, 140, 150, 160, and 170 read all of data of the normal mats MAT0 to MAT7 and parity bits of the dummy mats DMAT0 to DMAT7, and perform an error correction operation. Furthermore, in a write operation of the banks BK0 to BK7, the free ECC calculation units 100, 110, 120, 130, 140, 150, 160, and 170 store data in the normal mats MAT0 to MAT7 and store parity bits in the dummy mats DMAT0 to DMAT7.

A burst length and the number of data input/output lines may differ according to the type and the structure of a semiconductor device. The number of column lines to be selected may also differ according to the burst length and the number of data input/output lines of the semiconductor device. A different number of column selection signals are activated by column addresses inputted from an exterior. Therefore, among sensing units of a mat selected by a read/write command, data of a sense amplifier selected by the column address may be inputted/outputted.

The plurality of free ECC calculation units 100, 110, 120, 130, 140, 150, 160, and 170 calculate ECCs corresponding to data and parity bits applied from the plurality of banks BK0 to BK7 through the data lines I0 and the parity lines PI0.

Furthermore, the main ECC calculation unit 200 may perform an ECC calculation corresponding to data applied from the plurality of free ECC calculation units 100, 110, 120, 130, 140, 150, 160, and 170 and parity bits applied from the parity lines PI0.

It is assumed that the number of data lines I0 connected to the plurality of normal mats MAT0 to MAT7 is 64 even though only 4 data lines are shown connected to each normal mat MAT0 to MAT7. Then, in a general case, an ECC calculation unit requires seven (or eight) parity bits.

Accordingly, the number of parity lines PI0 is 7 (or 8). In an active operation, when a read or write command is applied and the plurality of normal mats MAT0 to MAT7 operate in units of 64 data lines I0, an ECC calculation unit operates.

However, in the embodiment of the present disclosure, in a normal active (read or write operation) operation, ECC calculation is not performed, but in a refresh operation, data is output from the banks BK0 to BK7 via the free ECC calculation units 100, 110, 120, 130, 140, 150, 160, and 170 and is combined with one another by the main ECC calculation unit 200 to perform an ECC calculation operation. As the number of bits calculated at a time is large, parity bits for ECC are reduced.

That is, in an auto-refresh operation of the semiconductor device, the main ECC calculation unit 200 and free ECC calculation units 100, 110, 120, 130, 140, 150, 160, and 170 may perform the ECC calculation operation in units of all banks. Accordingly, the respective free ECC calculation units 100, 110, 120, 130, 140, 150, 160, and 170 do not correct all data outputted from the banks BK0 to BK7.

In such a case, the number of parity bits required in the plurality of dummy mats DMAT0 to DMAT7 is only 2. Furthermore, the number of parity lines PI0 connected to each of the dummy mats DMAT0 to DMAT7 is 2. That is, as with the embodiment of the present disclosure, when the main ECC calculation unit 200 is used, the number of parity lines PI0 connected to the dummy mats DMAT0 to DMAT7 can be reduced as compared with the related art.

Figure 2A:
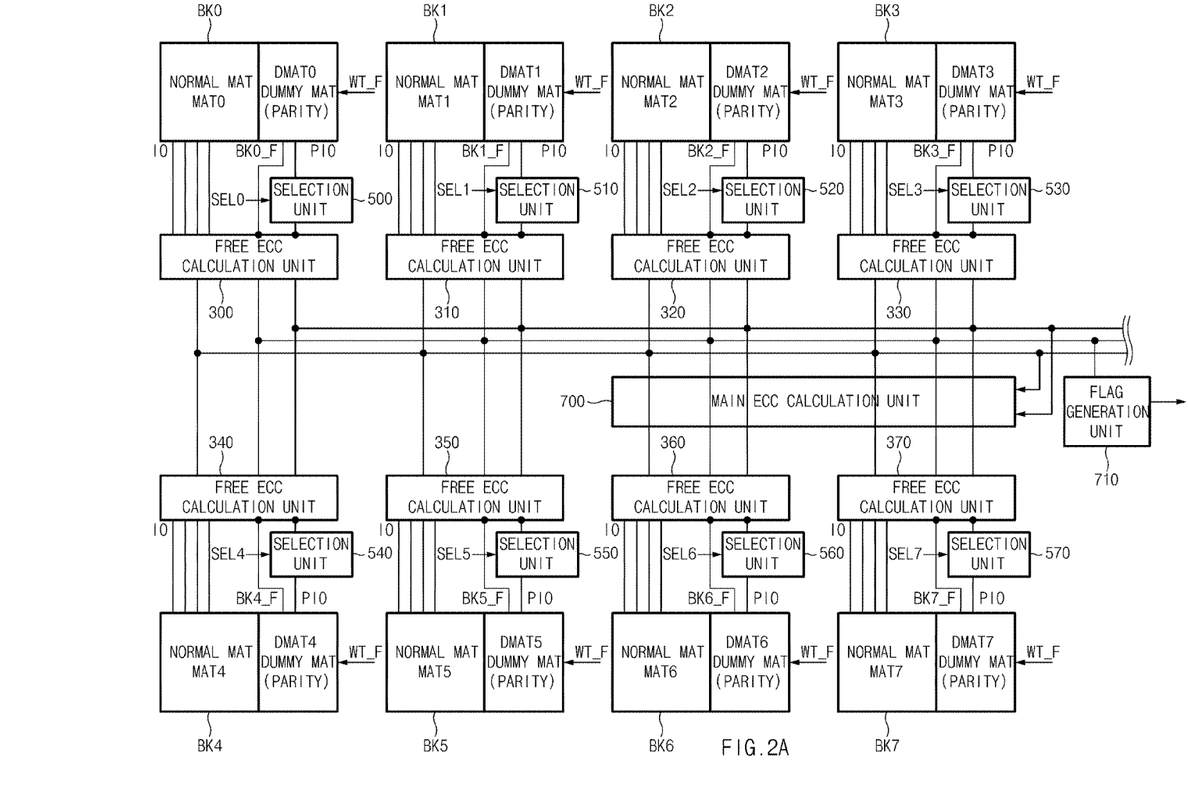
FIGS. 2A and 2B are configuration diagrams of semiconductor devices according to other embodiments of the present disclosure.
Figure 2B:
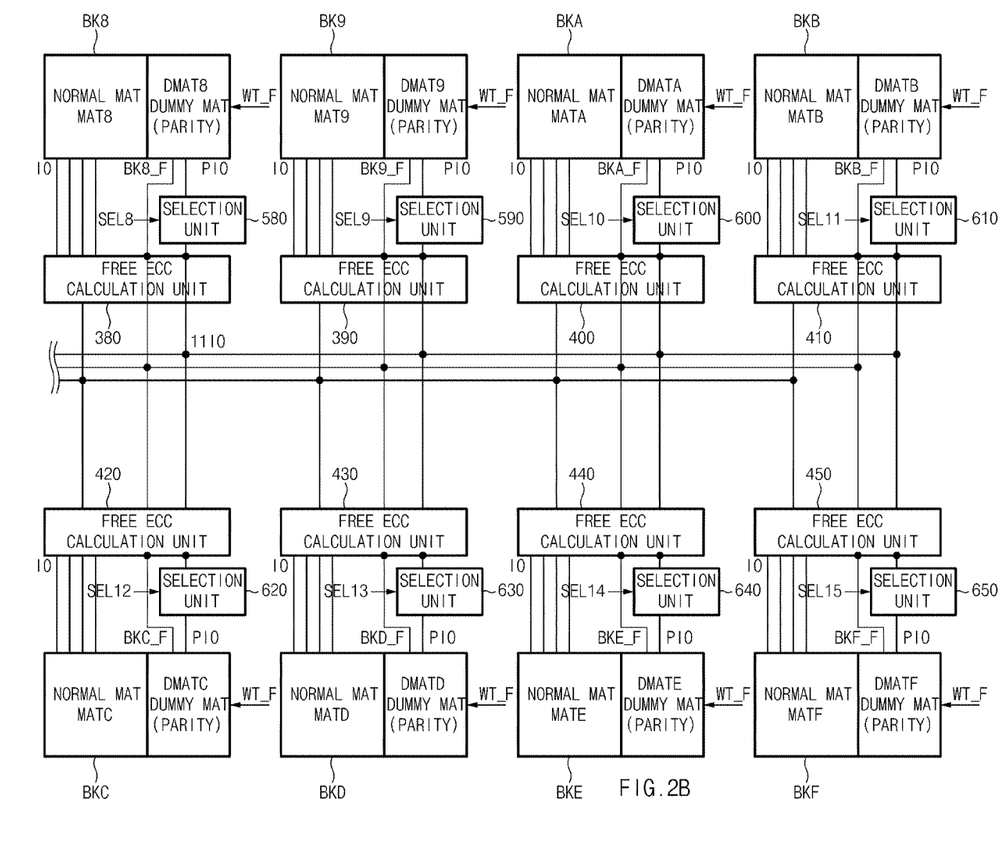

FIG. 2, comprised of FIG. 2A and FIG. 2B, is a configuration diagram of a semiconductor device according to another embodiment of the present disclosure.

The other embodiment of the present disclosure includes a plurality of banks BK0 to BK9 and BKA to BKF, a plurality of free error correction code (hereinafter, referred to as ECC) calculation units 300, 310, 320, 330, 340, 350, 360, 370, 380, 390, 400, 410, 420, 430, 440, and 450; a plurality of selection units 500, 510, 520, 530, 540, 550, 560, 570, 580, 590, 600, 610, 620, 630, 640, and 650; a main ECC calculation unit 700; and a flag generation unit 710.

The semiconductor device is driven and divided into the plurality of banks BK0 to BK9 and BKA to BKF. The plurality of banks BK0 to BK9 and BKA to BKF include a plurality of normal mats MAT0 to MAT9 and MATA to MATF each having a plurality of memory cells, and a plurality of dummy mats DMAT0 to DMAT9 and DMATA to DMATF, respectively.

That is, a memory cell array is divided into sets of the normal mats MAT0 to MAT9 and MATA to MATF including a plurality of unit memory cells. A plurality of these normal mats MAT0 to MAT9 and MATA to MATF are arranged in a row direction and a column direction to form a plurality of mat rows and a plurality of mat columns.

Mats arranged at specific areas, such as the outermost peripheral portions of the plurality of normal mats MAT0 to MAT9 and MATA to MATF may be used as the dummy mats DMAT0 to DMAT9 and DMATA to DMATF. Such dummy mats DMAT0 to DMAT9 and DMATA to DMATF may be assigned as areas for storing parity bits.

Furthermore, the plurality of free ECC calculation units 300, 310, 320, 330, 340, 350, 360, 370, 380, 390, 400, 410, 420, 430, 440, and 450 are connected to the plurality of banks BK0 to BK9 and BKA to BKF through data lines I0, flag lines BK0_F to BK9_F and BKA_F to BKF_F, and parity lines PI0. The plurality of free ECC calculation units 300, 310, 320, 330, 340, 350, 360, 370, 380, 390, 400, 410, 420, 430, 440, and 450 perform an ECC calculation in units of the data lines I0, the flag lines BK(N)_F, and the parity lines PI0 of one bank BK, respectively.

The plurality of normal mats MAT0 to MAT9 and MATA to MATF input/output data of a specific unit through the data lines I0. Furthermore, the plurality of dummy mats DMAT0 to DMAT9 and DMATA to DMATF input/output parity bits of a specific unit through the parity lines PI0.

The plurality of dummy mats DMAT0 to DMAT9 and DMATA to DMATF input/output flag bits through the flag lines BK0_F to BK9_F and BKA_F to BKF_F. The flag lines BK0_F to BK9_F and BKA_F to BKF_F include a flag bit indicating 1-bit of information of "1" or "0" in order to determine whether data has been written in corresponding addresses of the dummy mats DMAT0 to DMAT9 and DMATA to DMATF.

In the embodiment of the present disclosure, on the basis of one bank, the number of data lines I0 may be 64, the number of parity lines PI0 may be 11, the number of flag lines BK0_F to BK9_F and BKA_F to BKF_F may be 1. When it is assumed that the number of all banks is 16, on the basis of all the banks BK0 to BK9 and BKA to BKF, the number of data lines I0 may be 1024, the number of parity lines PI0 may be 11, the number of flag lines BK0_F to BK9_F and BKA_F to BKF_F may be 16.

In a refresh operation, in order to perform an ECC calculation, it is necessary to know whether data has been changed after parity bits are stored in corresponding dummy mats DMAT0 to DMAT9 and DMATA to DMATF. Accordingly, in a normal write operation, a flag bit indicating that data has been changed is separately stored in the dummy mats DMAT0 to DMAT9 and DMATA to DMATF. Such flag bit information is outputted to the plurality of free ECC calculation units 300, 310, 320, 330, 340, 350, 360, 370, 380, 390, 400, 410, 420, 430, 440, and 450 through the flag lines BK0_F to BK9_F and BKA_F to BKF_F.

As described above, in an embodiment of the present disclosure, the data lines I0 for inputting/outputting normal data, the flag lines BK0_F to BK9_F and BKA_F to BKF_F for inputting/outputting flag bits, and the parity lines PI0 for inputting/outputting parity bits are separate from one another. In such a case, in a write or read operation, data may be inputted/outputted through the data lines I0 separately from the parity lines PI0 and the flag lines BK0_F to BK9_F and BKA_F to BKF_F.

In a refresh operation, the free ECC calculation units 300, 310, 320, 330, 340, 350, 360, 370, 380, 390, 400, 410, 420, 430, 440, and 450 read all of the data of the normal mats MAT0 to MAT9 and MATA to MATF and parity bits of the dummy mats DMAT0 to DMAT9 and DMATA to DMATF, and performs an error correction operation. Furthermore, in a write operation on the banks BK0 to BK9 and BKA to BKF, the free ECC calculation units 300, 310, 320, 330, 340, 350, 360, 370, 380, 390, 400, 410, 420, 430, 440, and 450 store data in the normal mats MAT0 to MAT9 and MATA to MATF and store parity bits in the dummy mats DMAT0 to DMAT9 and DMATA to DMATF.

Furthermore, in the refresh operation, the free ECC calculation units 300, 310, 320, 330, 340, 350, 360, 370, 380, 390, 400, 410, 420, 430, 440, and 450 calculate ECCs in correspondence to data, flag bits, and parity bits applied from the plurality of banks BK0 to BK9 and BKA to BKF through the data lines I0, the parity lines PI0, and the flag lines BK0_F to BK9_F and BKA_F to BKF_F.

Furthermore, the plurality of selection units 500, 510, 520, 530, 540, 550, 560, 570, 580, 590, 600, 610, 620, 630, 640, and 650 selectively output parity data, which is applied from the parity lines PI0 of the dummy mats DMAT0 to DMAT9 and DMATA to DMATF, to the main ECC calculation unit 700 in correspondence to a plurality of selection signals SEL<0:15>. Only any one of the plurality of selection units 500, 510, 520, 530, 540, 550, 560, 570, 580, 590, 600, 610, 620, 630, 640, and 650 is activated by the plurality of selection signals SEL<0:15>. Accordingly, data is inputted/outputted through data lines, which connect the plurality of selection units 500, 510, 520, 530, 540, 550, 560, 570, 580, 590, 600, 610, 620, 630, 640, and 650 to the main ECC calculation unit 700, in units of one bank (for example, in units of 11 parity lines PI0).

The main ECC calculation unit 700 performs ECC calculation corresponding to data applied from the plurality of selection units 500, 510, 520, 530, 540, 550, 560, 570, 580, 590, 600, 610, 620, 630, 640, and 650, in the refresh operation. That is, the main ECC calculation unit 700 performs a part of the ECC calculation according to each bank through the plurality of free ECC calculation units 300, 310, 320, 330, 340, 350, 360, 370, 380, 390, 400, 410, 420, 430, 440, and 450. The main ECC calculation unit 700 then combines ECC results of the plurality of free ECC calculation units 300, 310, 320, 330, 340, 350, 360, 370, 380, 390, 400, 410, 420, 430, 440, and 450 with one another, and performs final ECC calculation.

For example, based on 16 banks, the main ECC calculation unit 700 combines 16 flag bits applied from the banks BK0 to BK9 and BKA to BKF with 11 parity bits applied from one bank BK by the selection units 500, 510, 520, 530, 540, 550, 560, 570, 580, 590, 600, 610, 620, 630, 640, and 650, and performs an ECC operation corresponding to the total 27 pieces of bit information.

Furthermore, the flag generation unit 710 receives flag bits applied from the dummy mats DMAT0 to DMAT9 and DMATA to DMATF through the flag lines BK0_F to BK9_F and BKA_F to BKF_F. Then, the flag generation unit 710 combines flag bits received from the flag lines BK0_F to BK9_F and BKA_F to BKF_F with one another, and outputs a flag write signal WT_F for calculating parity bits to the dummy mats DMAT0 to DMAT9 and DMATA to DMATF.

That is, the flag bits indicate the write states of the dummy mats DMAT0 to DMAT9 and DMATA to DMATF. The flag generation unit 710 determines the flag bits applied from the flag lines BK0_F to BK9_F and BKA_F to BKF_F, and outputs the flag write signal WT_F for controlling the write operation of a flag signal to the banks BK0 to BK9 and BKA to BKF.

According to the embodiment of FIG. 2, in the refresh operation, the main ECC calculation unit 700 combines output data of the banks BK0 to BK9 and BKA to BKF with one another and performs the ECC calculation operation. That is, in the auto-refresh operation of the semiconductor device, a specific bank may be selected and the ECC calculation operation may be performed at a time. As the number of bits operated on at one time is large, parity bits for ECC are reduced.

It is assumed that the number of data lines I0 connected to the plurality of normal mats MAT0 to MAT9 and MATA to MATF is 64. Then, the number of parity lines PI0 connected to the dummy mats DMAT0 to DMAT9 and DMATA to DMATF is 11. In correspondence to a refresh address, all parity bits are concentrically arranged at a specific bank BK.

For example, a selection control unit (which will be described in FIG. 3) may activate the selection signal SEL<0> of the plurality of selection signals SEL<0:15> in correspondence to the refresh address. When the selection signal SEL<0> is activated, the selection unit 500 operates.

Then, the bank BK0 is selected, so that parity data of the parity line PI0 connected to the dummy mat DMAT0 is transferred to the selection unit 500. The data of the selection unit 500 is transferred to the main ECC calculation unit 700, so that an error correction operation is performed.

The embodiment of the present disclosure includes the selection units 500, 510, 520, 530, 540, 550, 560, 570, 580, 590, 600, 610, 620, 630, 640, and 650, and the main ECC calculation unit 700 performs ECC calculation only for a parity bit of a bank selected from the banks BK0 to BK9 and BKA to BKF selected by the selection units 500, 510, 520, 530, 540, 550, 560, 570, 580, 590, 600, 610, 620, 630, 640, and 650, so that it is possible to reduce the number of lines to which parity bits are transferred.

With the shrinkage of the technology of a semiconductor device, the reliability of cell data may be lowered. In order to solve such a problem, various methods have been proposed. One method is to provide an ECC circuit in memory. Data bits and parity bits are all stored in memory, and when an error has occurred, the error is corrected through the ECC circuit.

However, when the ECC circuit is provided in memory, because a cell area for storing the parity bits is required, a chip size may increase. In this regard, in the embodiment of the present disclosure, an additional cell area is not arranged in order to store parity bits and an on-chip ECC circuit is realized using the dummy mats DMAT0 to DMAT9 and DMATA to DMATF, thereby improving data reliability.

Furthermore, in the embodiment of the present disclosure, the example, in which the number of banks BK0 to BK9 and BKA to BKF is 16, the number of normal mats MAT0 to MAT9 and MATA to MATF is 16, the number of dummy mats DMAT0 to DMAT9 and DMATA to DMATF is 16, the number of data lines I0 is 64, and the number of parity lines PI0 is 2 or 11, has been described. However, the embodiment of the present disclosure is not limited thereto, and the sizes and the number of elements and lines may be sufficiently changed.

Figure 3:
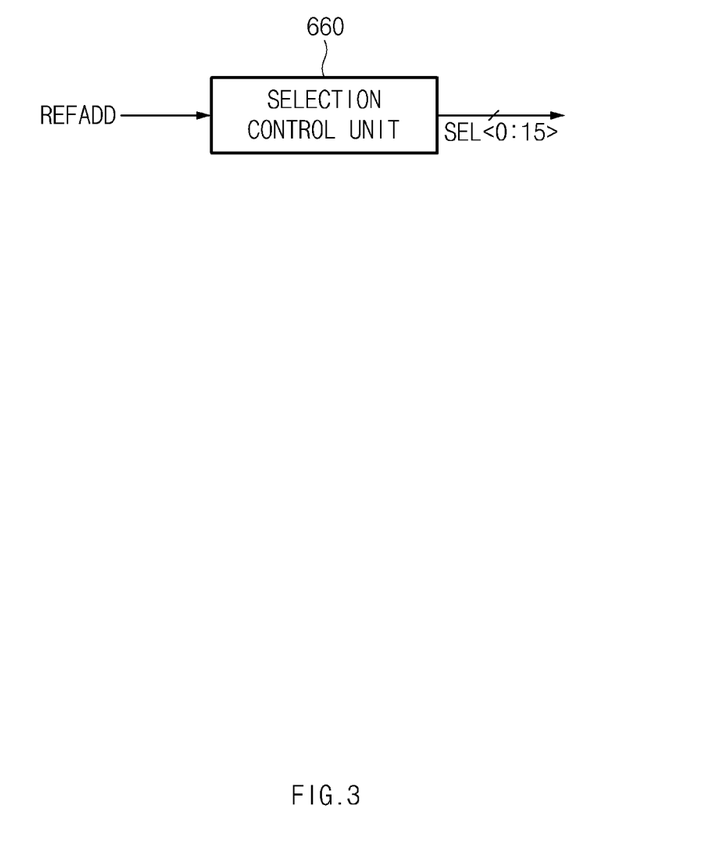
FIG. 3 is a configuration diagram of a selection control unit of a semiconductor device of FIG. 2.

FIG. 3 is a configuration diagram of a selection control unit 660 of FIG. 2.

The selection control unit 660 generates the plurality of selection signals SEL<0:15> in correspondence to a refresh address REFADD.

A corresponding one of the selection units 500, 510, 520, 530, 540, 550, 560, 570, 580, 590, 600, 610, 620, 630, 640, and 650 is activated in correspondence to the plurality of selection signals SEL<0:15>, so that the parity bits of the parity line PI0 can be transferred to the main ECC calculation unit 700.

In the embodiment of the present disclosure, on the basis of 16 banks, 16 selection signals SEL<0:15> may be outputted.

Figure 4:
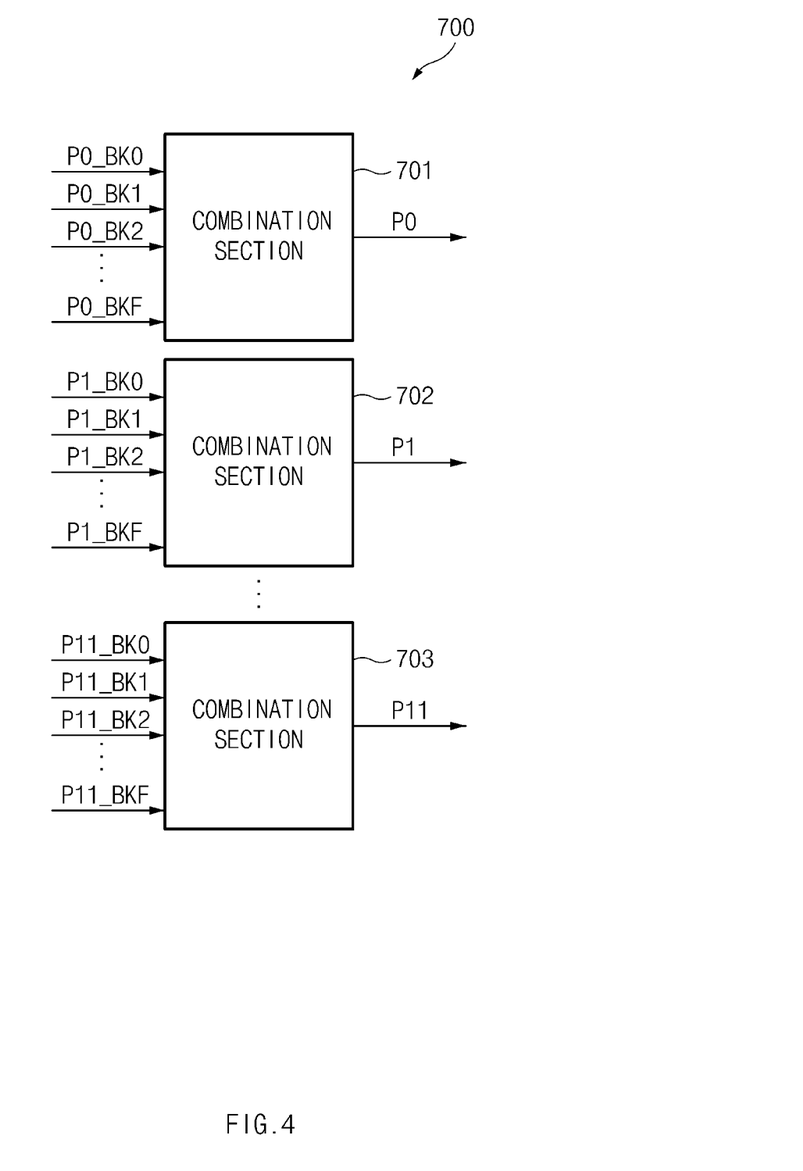
FIG. 4 is a detailed configuration diagram of a main ECC calculation unit of FIG. 2.

FIG. 4 is a detailed configuration diagram of the main ECC calculation unit 700 of FIG. 2.

The main ECC calculation unit 700 includes a plurality of combination sections 701 to 703 configured to combine data applied from the plurality of free ECC calculation units 300, 310, 320, 330, 340, 350, 360, 370, 380, 390, 400, 410, 420, 430, 440, and 450 with one another, and outputs combination signals P0 to P11.

The combination section 701 combines data P0_BK0 to P0_BKF applied from the free ECC calculation units 300, 310, 320, 330, 340, 350, 360, 370, 380, 390, 400, 410, 420, 430, 440, and 450 with one another, and outputs the combination signal P0. The combination section 701 may include an exclusive OR gate that performs an exclusive OR operation on the data P0_BK0 to P0_BKF.

The combination section 702 combines data P1_BK0 to P1_BKF applied from the free ECC calculation units 300, 310, 320, 330, 340, 350, 360, 370, 380, 390, 400, 410, 420, 430, 440, and 450 with one another, and outputs the combination signal P1. The combination section 702 may include an exclusive OR gate that performs an exclusive OR operation on the data P1_BK0 to P1_BKF.

The combination section 703 combines data P11_BK0 to P11_BKF applied from the free ECC calculation units 300, 310, 320, 330, 340, 350, 360, 370, 380, 390, 400, 410, 420, 430, 440, and 450 with one another, and outputs the combination signal P11. The combination section 703 may include an exclusive OR gate that performs an exclusive OR operation on the data P11_BK0 to P11_BKF.

In the above data P0_BK0 to P0_BKF, P1_BK0 to P1_BKF, and P11_BK0 to P11_BKF, numerals after "BK" indicate information on the bank BK0 to BK9 and BKA to BKF. For example, the data P0_BK0 indicates data applied from the free ECC calculation unit 300 of the bank BK0. The data P11_BKF indicates data applied from the free ECC calculation unit 450 of the bank BKF.

Figure 5:
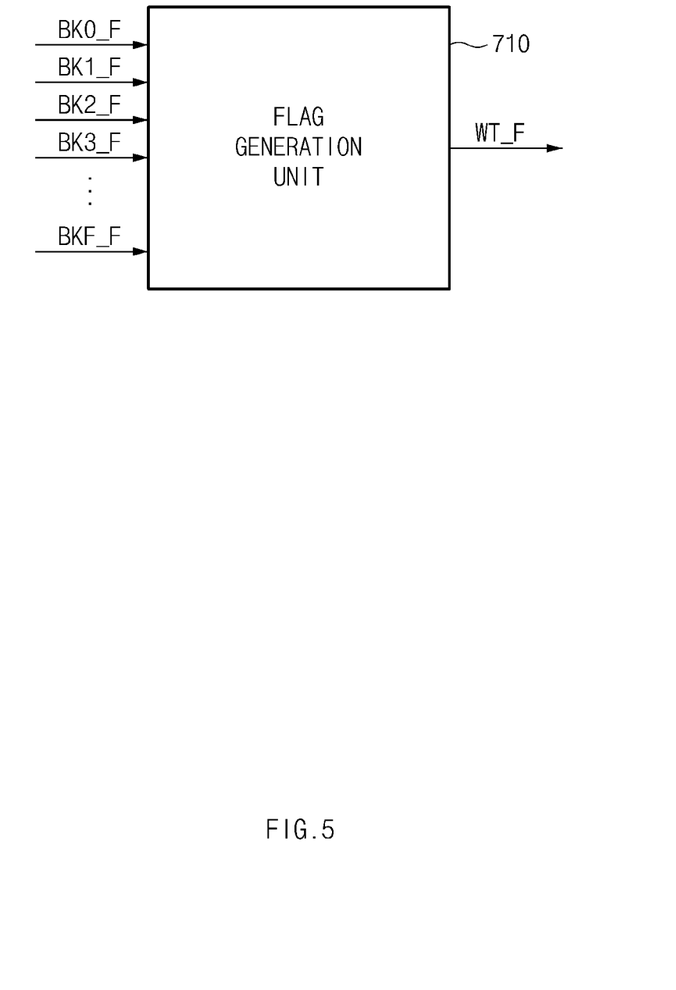
FIG. 5 is a detailed configuration diagram of a flag generation unit of FIG. 2.

FIG. 5 is a detailed configuration diagram of the flag generation unit 710 of FIG. 2.

The flag generation unit 710 combines the flag bits applied from the flag lines BK0_F to BK9_F and BKA_F to BKF_F of the dummy mats DMAT0 to DMAT9 and DMATA to DMATF, and outputs the flag write signal WT_F. When at least one of the signals of the plurality of flag lines BK0_F to BK9_F and BKA_F to BKF_F is activated, the flag generation unit 710 activates the flag write signal WT_F. Such a flag generation unit 710 may include an OR gate that performs an OR operation on the plurality of flag lines BK0_F to BK9_F and BKA_F to BKF_F.

When data has been changed in periods during the refresh operation, because previously stored parity information may be changed, parity calculation should be performed again. Accordingly, when new data has been written in any one bank, the flag write signal WT_F is enabled. Accordingly, parity bits are calculated on the basis of data stored in banks.

Figure 6:
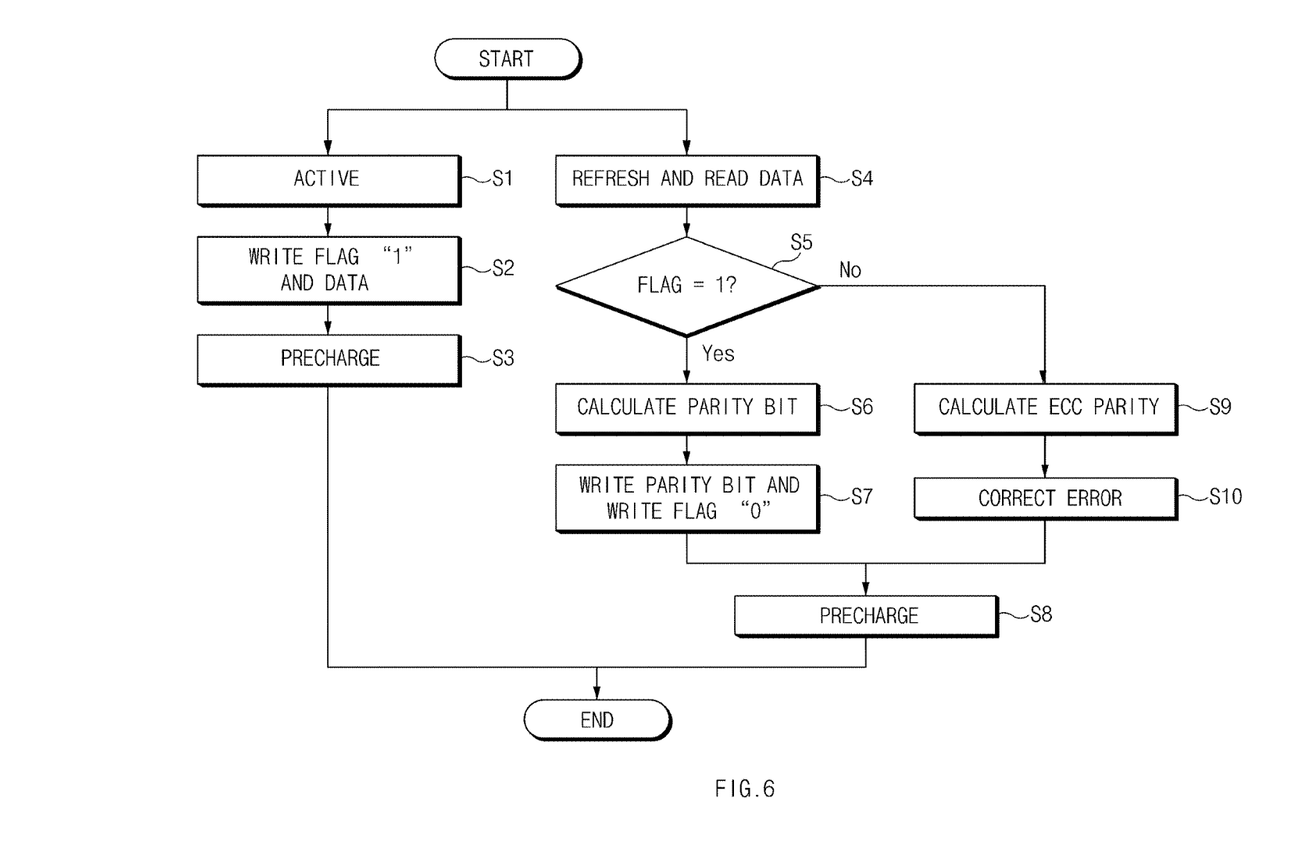
FIG. 6 is a flowchart for explaining an operation of a semiconductor device of FIG. 2.

FIG. 6 is a flowchart for explaining an operation of the semiconductor device of FIG. 2.

In an active operation (step S1), data is written in the normal mats MAT0 to MAT9 and MATA to MATF. Then, the flag generation unit 710 combines data, such as flag bits, of the flag lines BK0_F to BK9_F and BKA_F to BKF_F with one another and writes a flag bit "1" in the dummy mats DMAT0 to DMAT9 and DMATA to DMATF (step S2). Then, the flag generation unit 710 performs a precharge operation for the plurality of banks BK0 to BK9 and BKA to BKF (step S3).

Meanwhile, in a refresh operation, data of the normal mats MAT0 to MAT9 and MATA to MATF and data stored in the dummy mats DMAT0 to DMAT9 and DMATA to DMATF are read (step S4). The flag generation unit 710 receives data of the flag lines BK0_F to BK9_F and BKA_F to BKF_F and determines whether the flag bit is "1" (step S5).

In the refresh operation, in order to perform ECC calculation, it is necessary to know whether data has changed after parity bits are stored in corresponding dummy mats DMAT0 to DMAT9 and DMATA to DMATF. Accordingly, a flag bit indicating that data has changed in a normal write operation is separately stored in the dummy mats DMAT0 to DMAT9 and DMATA to DMATF.

When the flag bit is "1", since data has been written and data has changed, parity bits are calculated (step S6). That is, when a refresh command is applied, the flag bit is read and it is determined whether data has been written in a corresponding address. For example, when it is determined that at least any one of the data of the flag lines BK0_F to BK9_F and BKA_F to BKF_F has been written, a parity mode is performed and parity bits are calculated.

Then, the flag write signal WT_F is activated and the parity bits are calculated to write parity bits and are rewritten in the dummy mats DMAT0 to DMAT9 and DMATA to DMATF. That is, flag data is changed and a flag bit "0" is rewritten in the dummy mats DMAT0 to DMAT9 and DMATA to DMATF (step S7). Then, a precharge operation is performed for the plurality of banks BK0 to BK9 and BKA to BKF (step S8).

However, in a refresh operation when the flag bit is not "1", it is determined that new data has not been written in the corresponding address. Accordingly, data of the normal mats MAT0 to MAT9 and MATA to MATF and parity data of the dummy mats DMAT0 to DMAT9 and DMATA to DMATF are read and ECC parities are calculated through the plurality of free ECC calculation units 300, 310, 320, 330, 340, 350, 360, 370, 380, 390, 400, 410, 420, 430, 440, and 450 and the main ECC calculation unit 700 (step S9). When an error has occurred as a result of the calculation, the error is corrected (step S10). Then, a precharge operation is performed for the plurality of banks BK0 to BK9 and BKA to BKF (step S8).

While various embodiments have been described above, it will be understood to those skilled in the art that the embodiments described are by way of example only. Accordingly, the semiconductor device and the driving method thereof described herein should not be limited based on the described embodiments.

What is claimed is:

1. A semiconductor device comprising:
   a plurality of normal mats including a plurality of memory cells and connected to data lines;
   a plurality of dummy mats arranged in specific areas of the plurality of normal mats and inputting/outputting parity bits through parity lines of a specific circuit;
   a plurality of free ECC (Error Correction Code) calculation circuits that perform ECC calculations corresponding to data applied through the data lines and the parity lines; and
   a main ECC calculation circuit that combines data applied from the plurality of free ECC calculation circuits with one another and performs an ECC calculation,
   wherein the plurality of normal mats input/output normal data and the plurality of dummy mats input/output parity bits.

2. The semiconductor device of claim 1, wherein the plurality of free ECC calculation circuits perform the ECC calculation in units of the data lines corresponding to one bank and the parity lines corresponding to one bank.

3. The semiconductor device of claim 1, wherein the main ECC calculation circuit performs the ECC calculation in units of all banks.

4. The semiconductor device of claim 1, wherein the plurality of free ECC calculation circuits and the main ECC calculation circuit perform the ECC calculation in a refresh operation.

5. The semiconductor device of claim 1, wherein the data lines and the parity lines are arranged to be separate from each other.

6. A semiconductor device comprising:
   a plurality of normal mats including a plurality of memory cells and connected to data lines;
   a plurality of dummy mats arranged in specific areas of the plurality of normal mats, inputting/outputting parity bits through parity lines of a specific circuit, and inputting/outputting flag bits through flag lines of a specific circuit;
   a plurality of selection circuits that selectively control output of the parity bits of the parity lines in correspondence to selection signals;
   a plurality of free ECC (Error Correction Code) calculation circuits that perform ECC calculation in correspondence to data applied through the data lines and the parity lines; and
   a main ECC calculation circuit that combines data applied from the plurality of free ECC calculation circuits with one another and performs ECC calculation,
   wherein the plurality of normal mats input/output normal data and the plurality of dummy mats input/output parity bits.

7. The semiconductor device of claim 6, wherein the plurality of free ECC calculation circuits perform the ECC calculation in units of the data lines corresponding to one bank, the parity lines corresponding to one bank, and the flag lines corresponding to one bank.

8. The semiconductor device of claim 6, wherein the main ECC calculation circuit performs the ECC calculation in units of the parity bits applied from one bank selected by the selection circuits.

9. The semiconductor device of claim 6, wherein the plurality of free ECC calculation circuits and the main ECC calculation circuit perform the ECC calculation in a refresh operation.

10. The semiconductor device of claim 6, wherein the data lines, the parity lines, and the flag lines are arranged to be separate from one another.

11. The semiconductor device of claim 6, further comprising:
a flag generation circuit connected to the flag line, combines the flag bits of each bank with one another, and outputting a flag write signal to the plurality of dummy mats.

12. The semiconductor device of claim 11, wherein the flag generation circuit activates the flag write signal when at least one of the flag bits of each bank is activated.

13. The semiconductor device of claim 6, wherein the flag bit includes 1-bit of information for determining whether data has been written in a corresponding dummy mat.

14. The semiconductor device of claim 6, wherein in a refresh operation, when the flag bit is at a first logic level, the parity bits are calculated to write parity bits in the plurality of dummy mats and the flag bit is written in the dummy mats at a second logic level.

15. The semiconductor device of claim 6, wherein in a refresh operation, when the flag bit is at a second logic level, ECC parities are calculated and an error is corrected.

16. The semiconductor device of claim 6, wherein only one of the plurality of selection circuits is activated in correspondence to the selection signals.

17. The semiconductor device of claim 6, wherein further comprising:
a selection control circuit that controls the selection signals in correspondence to a refresh address.

18. The semiconductor device of claim 6, wherein the main ECC calculation circuit comprises:
a plurality of combination sections that combine data applied from the plurality of free ECC calculation circuits with one another.

19. A method for driving a semiconductor device including a plurality of normal mats connected to data lines, a plurality of dummy mats arranged in specific areas of the plurality of normal mats and inputting/outputting parity bits through parity lines, the method comprising:
reading data of the normal mats and data stored in the dummy mats in a refresh operation;
receiving data of flag lines connected to the dummy mats and determining whether a flag bit is at a first logic level;
calculating the parity bits and writing a flag bit having a second logic level in the dummy mats when the flag bit is at the first logic level, and reading the data of the normal mats and parity data of the dummy mats, calculating a plurality of ECC parities, and correcting an error when the flag bit is not at the first logic level; and
performing a precharge operation with respect to banks including the normal mats and the dummy mats,
wherein the plurality of normal mats input/output normal data and the plurality of dummy mats input/output parity bits.

20. The driving method of the semiconductor device of claim 19, further comprising the steps of:
writing data in the normal mats in an active operation;
combining data of the flag lines with one another and writing the flag bit having the first logic level in the dummy mats; and
performing the precharge operation with respect to the banks.

* * * * *